(12) United States Patent
Lin

(10) Patent No.: US 8,367,540 B2
(45) Date of Patent: Feb. 5, 2013

(54) INTERCONNECT STRUCTURE INCLUDING A MODIFIED PHOTORESIST AS A PERMANENT INTERCONNECT DIELECTRIC AND METHOD OF FABRICATING SAME

(75) Inventor: Qinghuang Lin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 12/622,111

(22) Filed: Nov. 19, 2009

(65) Prior Publication Data

US 2011/0115090 A1    May 19, 2011

(51) Int. Cl.
*H01L 21/22* (2006.01)
*H01L 21/4763* (2006.01)

(52) U.S. Cl. ......... 438/618; 438/637; 438/551; 438/636

(58) Field of Classification Search .................. 438/637, 438/638, 618, 623, 629, 639, 640, 667, 668, 438/672, 675, 622, 636, 761, 671, 551, 552
See application file for complete search history.

(56) References Cited

U.S. PATENT DOCUMENTS

| | | | |
|---|---|---|---|
| 4,371,605 A | 2/1983 | Renner | |
| 5,789,027 A | 8/1998 | Watkins et al. | |
| 5,886,102 A | 3/1999 | Sinta et al. | |
| 5,939,236 A | 8/1999 | Pavelchek et al. | |
| 6,025,260 A | 2/2000 | Lien et al. | |
| 6,087,064 A | 7/2000 | Lin et al. | |
| 6,093,508 A | 7/2000 | Cote | |
| 6,214,719 B1 | 4/2001 | Nag | |
| 6,455,416 B1 | 9/2002 | Subramanian et al. | |
| 6,492,256 B2 | 12/2002 | Lee et al. | |
| 6,492,732 B2 | 12/2002 | Lee et al. | |
| 6,514,667 B2 | 2/2003 | Angelopoulos et al. | |
| 6,566,019 B2 | 5/2003 | Kling et al. | |
| 6,649,531 B2 | 11/2003 | Cote et al. | |
| 6,780,753 B2 | 8/2004 | Latchford et al. | |

(Continued)

FOREIGN PATENT DOCUMENTS

| | | |
|---|---|---|
| CA | 1204547 | 5/1986 |
| JP | 01293339 | 11/1989 |

OTHER PUBLICATIONS

U.S. Appl. No. 12/126,287 entitled, "Photopatternable Dielectric Materials For BEOL Applications and Methods for Use", filed on May 23, 2008, first named inventor: Robert D. Allen.

(Continued)

*Primary Examiner* — Chuong A. Luu
(74) *Attorney, Agent, or Firm* — Scully, Scott, Murphy & Presser, P.C.; Daniel P. Morris, Esq.

(57) ABSTRACT

A photoresist conversion that changes a patterned photoresist into a permanent patterned interconnect dielectric is described. The photoresist conversion process includes adding a dielectric enabling element into a patterned photoresist. The dielectric enabling element-containing photoresist is converted into a permanent patterned dielectric material by performing a curing step. In one embodiment, a method is described that includes providing at least one photoresist to an upper surface of a substrate. At least one interconnect pattern is formed into the at least one photoresist. A dielectric enabling element is added to the patterned photoresist and thereafter the patterned photoresist including the dielectric enabling element is cured into a cured permanent patterned dielectric material. The cured permanent patterned dielectric material includes the dielectric enabling therein.

20 Claims, 5 Drawing Sheets

U.S. PATENT DOCUMENTS

| | | |
|---|---|---|
| 6,787,469 B2 | 9/2004 | Houston et al. |
| 6,805,109 B2 | 10/2004 | Cowan |
| 6,861,180 B2 | 3/2005 | Chang |
| 6,861,367 B2 | 3/2005 | Gilton et al. |
| 7,030,031 B2 | 4/2006 | Wille et al. |
| 7,041,748 B2 | 5/2006 | Lin et al. |
| 7,056,840 B2 | 6/2006 | Miller et al. |
| 7,064,078 B2 | 6/2006 | Liu et al. |
| 7,071,532 B2 | 7/2006 | Geffken et al. |
| 7,091,611 B2 | 8/2006 | Ahn et al. |
| 7,138,329 B2 | 11/2006 | Lur et al. |
| 7,253,095 B2 | 8/2007 | Lur et al. |
| 7,306,853 B2 | 12/2007 | Lin et al. |
| 7,419,772 B2 | 9/2008 | Watkins et al. |
| 2001/0016412 A1 | 8/2001 | Lee et al. |
| 2001/0054766 A1 | 12/2001 | Dirahoui et al. |
| 2002/0163082 A1 | 11/2002 | Lee et al. |
| 2003/0073028 A1 | 4/2003 | Kim et al. |
| 2003/0129531 A1 | 7/2003 | Oberlander et al. |
| 2003/0198877 A1 | 10/2003 | Pfeiffer et al. |
| 2004/0048194 A1 | 3/2004 | Breyta et al. |
| 2004/0094821 A1 | 5/2004 | Lur et al. |
| 2004/0151489 A1 | 8/2004 | Zhou |
| 2004/0266201 A1 | 12/2004 | Wille et al. |
| 2005/0093158 A1 | 5/2005 | Liu et al. |
| 2005/0186515 A1 | 8/2005 | Watkins |
| 2005/0263896 A1 | 12/2005 | Lur et al. |
| 2006/0228895 A1 | 10/2006 | Chae et al. |
| 2007/0003841 A1 | 1/2007 | Choi |
| 2007/0020565 A1 | 1/2007 | Koh et al. |
| 2007/0054198 A1 | 3/2007 | Park |
| 2007/0148968 A1 | 6/2007 | Kwon et al. |
| 2007/0212649 A1 | 9/2007 | Lalbahadoersing et al. |
| 2007/0248899 A1 | 10/2007 | Choi |
| 2008/0173984 A1 | 7/2008 | Lin et al. |
| 2008/0286467 A1 | 11/2008 | Allen et al. |
| 2009/0079075 A1* | 3/2009 | Lin et al. ............... 257/739 |
| 2009/0079076 A1 | 3/2009 | Lin et al. |
| 2009/0081418 A1* | 3/2009 | Allen et al. ............ 428/195.1 |
| 2009/0174067 A1 | 7/2009 | Lin |
| 2009/0233226 A1 | 9/2009 | Allen et al. |
| 2010/0314767 A1* | 12/2010 | Chen et al. ............. 257/759 |
| 2011/0074044 A1* | 3/2011 | Lin et al. ............... 257/776 |

OTHER PUBLICATIONS

Owe-Yang, D.C., et al., "Double exposure for the contact layer of the 65-nm node", Proc. SPIE, 2005, Adv. Resist Technology and Processing, vol. 5753, pp. 171-180.

U.S. Appl. No. 12/569,200 entitled, "Patternable Low-K Dielectric Interconnect Structure With A Graded Cap Layer and Method of Fabrication", filed on Sep. 29, 2009, first named inventor: Qinghuang Lin.

U.S. Appl. No. 12/047,435 entitled, "Photopatternable Dielectric Materials For BEOL Applications and Methods For Use", filed on Mar. 13, 2008, first named inventor: Robert D. Allen.

* cited by examiner

INTERCONNECT STRUCTURE INCLUDING A MODIFIED PHOTORESIST AS A PERMANENT INTERCONNECT DIELECTRIC AND METHOD OF FABRICATING SAME

FIELD OF THE INVENTION

The present invention relates to interconnect structures and methods of fabricating the same. More particularly, the present invention relates to interconnect structures including a permanent interconnect dielectric which is derived from a photoresist utilizing a photoresist conversion process.

BACKGROUND

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, or a Cu alloy since Cu-based interconnects provide higher speed signal transmission between large numbers of transistors on a complex semiconductor chip as compared with aluminum, Al,-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., electrically conductive features) in a dielectric material having a dielectric constant that is less than the dielectric constant of silicon oxide.

The strategy to introduce low k materials (dielectric materials whose dielectric constant is less than the dielectric constant of silicon oxide) into advanced interconnect structures is difficult to implement due to the new materials chemistry of the low k materials that are being introduced. Firstly, low k materials exhibit fundamentally weaker electrical and mechanical properties as compared to silicon oxide. Secondly, the low k dielectric materials are typically susceptible to damage during the various interconnect processing steps. The damaged observed in the low k dielectrics is manifested by an increase in the dielectric constant and an increased moisture uptake, which may result in reduced performance and degraded device reliability.

Prior art interconnect integration schemes are very complex, inefficient, and costly. For example, a via-first LTO (low temperature oxide) integration scheme requires ten layers of films and twenty-one process steps to form a two-layer dual damascene dielectric structure. In other words, 80% of the films are not needed in the final interconnect structure.

Although immensely popular in semiconductor manufacturing, the prior art dual damascene integration schemes, such as the via-first LTO integration scheme, suffer from several drawbacks including: First, it constitutes a significant portion of manufacturing cost of advanced semiconductor chips as many layers, up to twelve layers for the state-of-the-art chips, are required to connect the minuscule transistors within a chip and to the printed circuit board. Second, it is a main yield detractor as the many layers of films required to form interconnect structures generate chances for defect introduction and, thus, degrade manufacturing yields. Third, it is very inefficient and embodies enormous complexity. The current dual damascene integration scheme requires many sacrificial films (80% of the film stack) to pattern and protect the fragile interlayer dielectric films from damage during processing. These sacrificial patterning and protective films have to be removed after patterning and copper plating. Fourth, the performance gain by introduction of new low k materials is often offset by the material degradation (damage) during processing and the need for high k non-sacrificial materials, such as a cap layer, a hardmask layer, or a thicker copper barrier layer. Fifth, the prior art complex dual damascene process lengthens manufacturing turn-around time and R&D development cycle. Sixth, the plasma etching process is an expensive and often unreliable process and requires significant up-front capital investment.

In view of the above, there is a need to simplify the formation of interconnects (single damascene and dual damascene) for cost-saving and manufacturing efficiency.

SUMMARY OF THE INVENTION

The problems described above in prior art processes of fabricating interconnect structures are solved in this application by using a dramatically simplified interconnect integration method. The present invention thus relates to methods of forming interconnect structures (single damascene and dual damascene) that are a permanent part of integrated circuits and microelectronic devices with interconnect dielectrics that are formed by a photoresist conversion process. More specifically, the present invention relates to methods of forming an interconnect structure by converting a photoresist into a patterned dielectric material that serves as a permanent interconnect dielectric material of the structure. The methods of the invention do not require the use of a separate low k interconnect dielectric material. As such, the methods described herein reduce the cost and the number of processing steps used in forming an interconnect structure.

This invention circumvents the drawbacks of prior art interconnect integration by converting a photoresist into a permanent patterned interconnect dielectric. The photoresist conversion process includes adding at least one dielectric enabling element into a patterned photoresist on a substrate. The patterned photoresist containing the at least one dielectric enabling element is converted into a permanent patterned dielectric material by a subsequent curing step. Thus, the method described herein avoids the complex sacrificial planarization and hardmask material and their related deposition and pattern transfer (plasma etching) steps required in prior art interconnect patterning. The method also allows formation of very small patterned dielectric structures formed by any patterning technique.

In one aspect of the present invention, a method of forming an interconnect structure is provided that includes providing at least one photoresist to an upper surface of a substrate. In some embodiments, the substrate may include a dielectric cap, an antireflective coating or a multilayered stack thereof. At least one interconnect pattern is formed into the at least one photoresist. At least one dielectric enabling element is incorporated into the patterned photoresist. The patterned photoresist having the at least one dielectric enabling element is thereafter cured into a cured permanent patterned dielectric material. The cured permanent patterned dielectric material includes the at least one dielectric enabling element therein.

The at least one dielectric enabling element is any atom, functional group, small molecule, oligomer, polymer, or copolymer of at least two monomers that imparts dielectric attributes to the patterned photoresist after cure and aids in maintaining pattern integrity after curing. In one embodiment of the present invention, the at least one dielectric enabling element is a silylating agent that can be incorporated into a photoresist having at least one functional group for incorporating the silylating agent.

In some embodiments of the present invention, an antireflective coating (ARC) is formed on the substrate prior to forming the photoresist. In another embodiment of the invention, a material stack comprising a dielectric cap and an ARC is formed on the substrate prior to forming the photoresist. When such materials are present, a step of forming contact holes through the ARC and/or material stack can be performed either after the step of incorporating the dielectric enabling element or the curing.

In yet a further embodiment of the present invention, an electrically conductive material such as, for example, Al, Cu or a Cu alloy, is formed into the patterned and cured permanent interconnect patterns and contact holes, if present. A planarization process such as chemical mechanical polishing can follow the step of filling the interconnect patterns with the electrically conductive material.

In any of the embodiments mentioned above, the interconnect patterns can comprise via openings, line openings, a combination of via openings located beneath line openings, or a combination of via openings located atop line openings. In one embodiment, it is preferred to have via openings located beneath line openings. It is observed that each individual pair of line/via openings or via/line openings are interconnected.

The photoresist employed in the present invention can include any material that can be imaged and patterned utilizing photolithography and other patterning techniques. Also, the photoresist bears functional groups that can incorporate at least one dielectric enabling element which can be converted into a permanent dielectric material. Illustrative examples of photoresists that can be employed include, but are not limited to, a positive-tone photoresist, a negative-tone photoresist, a photo-patternable low-k (PPLK) material, any material that is suitable for contact printing, such as nanoimprint and scanning probe lithography and the like or any combination thereof provided that it offers the ability to selectively incorporate at least one dielectric enabling element into an area where there is only photoresist material. The term "PPLK material" includes a functionalized polymer, copolymer or blend including at least two of any combination of polymers and/or copolymers having one or more acid-sensitive imageable groups. The dielectric enabling element employed enables formation of a permanent patterned dielectric material upon curing the patterned photoresist containing the same. Moreover, the dielectric enabling element aides in maintaining the resist pattern integrity after curing.

The formation of the interconnect patterns into the photoresist can be conducted by standard photolithograpgy methods such as G-line, I-line, DUV (248 nm, 193 nm, 157 nm and 126 nm), EUV (13.4 nm), direct write patterning, imprint contact printing, inkjet printing, screen printing and the like. Patterning can also be achieved by multi-patterning lithography. When the patterning method is optical lithography, it can be performed in a dry mode or an immersion mode where a fluid with a refractive index greater than that of air is placed between the lens elements and the photoresist.

The above mentioned method is generic for forming both single damascene and dual damascene structures.

In embodiments where dual damascene structures are desirable, the following method can be employed. A first photoresist is applied on an upper surface of a substrate. The substrate can include a dielectric cap, an antireflective coating or a multilayered stack thereof. The first photoresist is patterned to include first interconnect patterns. A second photoresist is applied to the first patterned photoresist and thereafter the second photoresist is patterned to include second interconnect patterns. In some embodiments, the first interconnect pattern can be recovered if it was lost during the application of the second photoresist. At least one dielectric enabling element is incorporated into the first and second patterned photoresists and thereafter curing is performed which converts both patterned photoresists into first and second cured permanent patterned dielectrics. The cured permanent patterned dielectrics both include the at least one dielectric enabling element therein.

In another embodiment of forming dual damascene structures, a first photoresist is applied on an upper surface of a substrate. The substrate can include a dielectric cap, an anti-reflective coating or a multilayered sack thereof. The first photoresist is patterned to include first interconnect patterns. At least one dielectric enabling element is incorporated into the first patterned photoresist and a subsequent curing is performed to convert the first patterned photoresist into a first cured permanent patterned dielectric. A second photoresist is then applied to the first cured permanent patterned dielectric and thereafter the second photoresist is patterned to include second interconnect patterns. In some embodiments the first interconnect pattern is recovered if it was lost during the application of the second photoresist. At least one dielectric enabling element is incorporated into the second patterned photoresist and thereafter curing is performed which converts the second patterned photoresist into a second cured permanent patterned dielectric. The first and second cured permanent patterned dielectrics both include the at least one dielectric enabling element therein.

In yet another embodiment of forming dual damascene structures, an antireflective coating (ARC) is formed on the substrate prior to forming the photoresist. In another embodiment of the present invention, a material stack comprising a dielectric cap and an ARC is formed on the substrate prior to forming the photoresist. When such materials are present, a step of forming contact holes through the ARC and/or material stack can be performed either after the step of incorporating the dielectric enabling element or curing.

In addition to the methods described above, the present invention also relates to interconnect structures which include a permanent patterned dielectric material including the dielectric enabling containing element. In some embodiments, a patterned ARC is also present and remains as a permanent material within the interconnect structure. In some embodiments, a patterned film stack comprising an ARC layer and a dielectric cap layer is also present and remains as a permanent material within the interconnect structure.

In general terms, the present invention provides an interconnect structure including at least one cured permanent patterned dielectric material located on a surface of a substrate. The at least one cured permanent patterned dielectric material is a cured product of a patterned photoresist that includes a dielectric enabling element therein. At least one conductively filled region is embedded within the at least one cured permanent patterned dielectric material.

In some embodiments and when a dual damascene interconnect structure is formed, the interconnect structure includes a first cured permanent patterned dielectric material located on a surface of a substrate, and a second cured permanent patterned dielectric material located atop the first cured permanent patterned dielectric material. The first and second cured permanent patterned dielectrics are cured products of first and second patterned photoresists, respectively, that include a dielectric enabling element therein. A conductive region is embedded within the first and second cured permanent patterned dielectrics.

DETAILED DESCRIPTION

Figure 1:
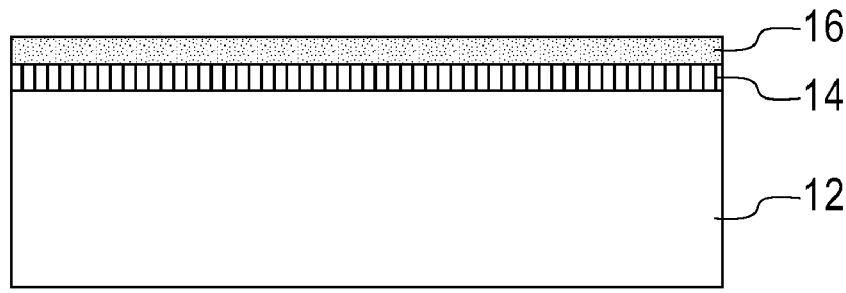
FIG. 1 is a pictorial representation (through a cross section view) illustrating an initial structure that can be employed in one embodiment of the present application.

The present invention, which provides interconnect structures including a cured permanent interconnect dielectric converted from a patterned photoresist containing at least one dielectric enabling element therein and methods of fabricating the same, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention will now be described in greater detail by referring to FIGS. 1-7 which illustrate the basic processing steps that can be employed in one embodiment of the invention. In the illustrated embodiment of FIGS. 1-7 a single damascene interconnect structure is formed, Reference is first made to FIG. 1 which illustrates an initial structure 10 that can be employed in the present application. The initial structure 10 includes a substrate 12, an optional dielectric cap 14 located on an upper surface of substrate 12, and an optional ARC 16 located on an upper surface of the optional dielectric cap 14. In embodiments in which the optional dielectric cap 14 is not present, the ARC 16 would be located on an upper surface of substrate 12.

The substrate 12 may comprise a semiconducting material, an electrically insulating material, an electrically conductive material, devices or structures made of these materials or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors, or organic semiconductors may be used. The substrate 12 may also be a flexible substrate containing devices that are suitable for high-speed roll-to-roll processing. In addition to these listed types of semiconducting materials, substrate 12 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices. In some embodiments, one or more semiconductor devices such as, for example, complementary metal oxide semiconductor (CMOS) devices, strained silicon devices, carbon-based (e.g., carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated on the semiconducting material.

When the substrate 12 is an electrically insulating material, the insulating material can be an organic insulator, an inorganic insulator or a combination thereof including multilayers. The substrate 12 can also include a photoresist that has been converted in a patterned dielectric material utilizing the photoresist conversion process described herein below. The electrically insulating materials may be part of a device, or devices or structures, which may be discrete or interconnected. These devices and structures may be for logic applications or memory applications.

When the substrate 12 is an electrically conducting material, the substrate may include, for example, polySi, an elemental metal, an alloy including at least one elemental metal, a metal silicide, a metal nitride or combinations thereof including multilayers.

When present, the optional dielectric cap 14 is formed directly on the surface of substrate 12 utilizing a standard deposition process such as, for example, chemical vapor deposition (CVD), plasma enhanced chemical vapor deposition (PECVD), atomic layer deposition (ALD), chemical solution deposition, or evaporation. The optional dielectric cap 14 comprises any suitable dielectric capping material such as, for example, SiC, SiN, $SiO_2$, a carbon doped oxide, a nitrogen and hydrogen doped silicon carbide SiC(N,H) or multilayers thereof. The optional dielectric cap 14 can be a continuous layer or a discontinuous layer. The optional dielectric cap 14 can be a layer with graded composition in the vertical direction. It can also be a select cap, such as CoWP.

A post deposition treatment may be applied to the optional dielectric cap 14 to modify the properties of either the entire layer or the surface of the dielectric cap. This post deposition treatment can be selected from heat treatment, irradiation of electromagnetic wave (such of ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of the post deposition treatment is to enhance the chemical, physical, electrical, and/or mechanical properties of the dielectric cap, such as adhesion strength. The chemical properties include the nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate can withstand, usually 500° C. This heat treatment can be conducted in an inert environment or within a chemical environment in a gas phase or a liquid phase. This treatment step may or may not be performed in the same tool as that used in forming the optional dielectric cap 14.

The post deposition treatment by irradiation of electromagnetic wave can be by ultra-violet (UV) light, microwave and the like. The UV light can be broadband with a wavelength range from 100 nm to 1000 nm. It can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions can be employed for this aspect of the present invention: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the optional dielectric cap 14.

The post deposition treatment by plasma treatment can be selected from an oxidizing plasma, a reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the optional dielectric cap 14.

The post deposition chemical treatment may be conducted in a gas phase or a liquid phase. The following conditions may be employed for this aspect of the present invention: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire dielectric cap 14 or is limited only to the surface of the dielectric cap 14. Example chemicals include adhesion promoters such as silanes, siloxanes and silylation agents. This treatment step may or may not be performed in the same tool as that used in forming the optional dielectric cap 14.

The thickness of the optional dielectric cap 14, when present, may vary depending on the technique used to form the same as well as the material make-up of the layer. Typically, the dielectric cap 14 has a thickness from 1 nm to 100 nm, with a thickness from 20 nm to 45 nm being more typical.

An antireflective coating (ARC) 16 is formed on a surface of the optional dielectric cap 14 if present, or directly on a surface of the substrate 12 when the dielectric cap 14 is not present. The ARC 16 employed has all of the following general characteristics: (i) It acts as an ARC during a lithographic patterning process; (ii) It withstands high-temperature BEOL integration processing (up to 500° C.); (iii) It prevents photoresist poisoning by the substrate; (iv) It provides vertical wall profile and sufficient etch selectivity between the photoresist and the ARC layer; (v) It serves as a permanent dielectric layer in a chip (low dielectric constant, preferably k<5, more preferably k<3.6); and (vi) It is compatible with conventional BEOL integration and produces reliable hardware.

Further discussion is now provided for characteristics (i)-(v).

Characteristic (i) ARC 16 acts as an antireflective coating (ARC) during a lithographic patterning process: ARC 16 may be designed to control reflection of light that is transmitted through the photoresist, reflected off the substrate 12 and back into the photoresist, where it can interfere with incoming light and cause the photoresist to be unevenly exposed. The ARC's optical constants are defined here as the index of refraction n and the extinction coefficient k. In general, ARC 16 can be modeled so as to find optimum optical parameters (n and k values) of the ARC as well as optimum thickness. The preferred optical constants of ARC 16 are in the range from n=1.2 to n=3.0 and k=0.01 to k=0.9, preferably n=1.4 to n=2.6 and k=0.02 to k=0.78 at a wavelength of 365, 248, 193 and 157, 126 nm and extreme ultraviolet (13.4 nm) radiation.

The optical properties and thickness of ARC 16 are optimized to obtain optimal resolution, profile control and to maximize the process window of the photoresist during the subsequent patterning steps, which is well known to those ordinarily skilled in the art.

Characteristic (ii) ARC 16 can withstand high-temperature BEOL integration processing (up to 500° C.): ARC 16 must withstand the harsh processing conditions during BEOL integration. These include high temperature and intense UV cure. The process temperature can be as high as 450° C. The intensity of the light used in the UV cure process can be as high as tens of $J/cm^2$.

Characteristic (iii) ARC 16 prevents photoresist poisoning by the substrate: The photoresist employed herein are preferably chemically amplified resists. They can be poisoned by any basic containment from the underlying substrate, such as a SiCN cap layer 14. ARC 16 must serve as a barrier layer to prevent basic contaminant from the underlying substrate from diffusing into the photoresist to poison the chemically amplified photoresist.

Characteristic (iv) ARC 16 provides vertical wall profile and sufficient etch selectivity between the photoresist and the ARC layer: ARC 16 should provide sufficient reflectivity control with reflectivity from the underlying substrate under a particular lithographic wavelength of less than 8%, preferably less than 5%, more preferably less than 2% and generate vertical side wafer profile. ARC 16 should also generate residue-free patterns with no footing. Moreover, the adhesion of the photoresist should be sufficient to prevent pattern collapse during patterning and the subsequent UV cure. ARC 16 should also be designed such that the etch selectivity during a subsequent ARC/cap open process is sufficiently high so that the opening of the ARC/cap stack does not erode a significant portion of the photoresist and degrade significantly its pattern profile. An etch selectivity (etch rate ratio of ARC/cap versus photoresist) is greater than 1, preferably greater than 3, more preferable greater than 5.

Characteristic (v) ARC 16 serves as a permanent dielectric layer in a chip: ARC 16 remains after patterning and cure of the photoresist. It serves as a permanent dielectric layer in a chip. Therefore, ARC 16 (after cure) must meet the requirements of an on-chip dielectric insulator, including electrical properties (low dielectric constant: preferably k less than 5, and more preferably k less than 3.6; dielectric breakdown field: greater than 2 MV/cm, preferably greater than 4 MV/cm, and more preferably greater than 6 MV/cm, leakage: less than $10^{-5}$ $A/cm^2$, preferably less than $10^{-7}$ $A/cm^2$, and more preferably less than $10^{-9}$ $A/cm^2$); mechanical properties (adhesion energy is equal to or greater than the cohesive energy of the weakest layer of the integrated film stack); must pass electrical and mechanical reliability tests.

The thickness of the ARC 16 may vary depending on the technique used to form the same as well as the material make-up of the layer. Typically, the ARC 16 has a thickness from 1 nm to 200 nm, with a thickness from 10 nm to 140 nm being more typical. The ARC 16 may be inorganic or a hybrid of inorganic and organic. ARC 16 may be a single layer or multilayer. It may also be a graded ARC with graded composition in the vertical direction.

Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may be employed as ARC 16 and may be deposited, for example, by plasma-enhanced chemical vapor deposition, spin-on techniques, spray coating, dip coating, etc. ARC 16 may be a single layer or multilayer. When ARC 16 is a multilayer ARC, the deposition of each layer may be the same or a combination of deposition methods can be used. The chemical composition of ARC 16 may be uniform or graded along the vertical direction. After applying ARC 16, particularly those from a liquid phase, a post deposition baking step is usually required to remove unwanted components, such as solvent, and to effect crosslinking. The post deposition baking step of ARC 16 is typically, but not necessarily always, performed at a temperature from 80° C. to 300° C., with a baking temperature from 120° C. to 200° C. being even more typical.

In some embodiments, the as-deposited ARC 16 may be subjected to a post deposition treatment to improve the properties of the entire layer or the surface of the ARC 16. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of this post deposition treatment is to enhance the chemical, physical, electrical, and/or mechanical properties of the ARC 16 and/or the film stack, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The conditions described above for the post treatment of the optional dielectric cap 14 may be used for the post treatment for ARC 16.

In one embodiment, the ARC 16 that is employed is an inorganic composition that includes elements of M, C (carbon) and H (hydrogen), wherein M is selected from at least one of the elements of Si, Ge, B, Sn, Fe, Ta, Ti, Ni, Hf and La. Such an ARC is described for example within U.S. Patent Publication No. 2009/0079076 the entire content of which is incorporated herein by reference. This inorganic ARC may optionally include elements of O, N, S, F or mixtures thereof. In some embodiments, M is preferably Si. In some embodiments, the ARC composition may also be referred to as a vapor deposited M:C:H: optionally X material, wherein M is as defined above, C and H are carbon and hydrogen element, respectively, and X is at least one element of O, N, S and F.

In one embodiment, ARC 16 is produced by a vapor or liquid phase deposition (such as, for example, CVD, PECVD, PVD, ALD and spin-on coating) method using appropriate precursors or combination of precursors containing elements described above.

In a preferred embodiment, ARC 16 is a Si:C:H:X film. These Si containing films are deposited from at least one Si containing precursor. More particularly, the Si:C:H:X films are deposited from at least one Si containing precursor with, or without, additions of nitrogen and/or oxygen and/or fluorine and/or sulfur containing precursors. The Si containing precursor that is employed can comprise any Si containing compound including molecules selected from silane ($SiH_4$) derivatives having the molecular formula $SiR_4$, cyclic Si containing compounds including cyclocarbosilane where the R substitutents may or may not be identical and are selected from H, alkyl, phenyl, vinyl, allyl, alkenyl or alkynyl groups that may be linear, branched, cyclic, polycyclic and may be functionalized with nitrogen containing substituents, any cyclic Si containing compounds including cyclosilanes, and cyclocarbosilanes.

Preferred Si precursors include, but are not limited to silane, methylsilane, dimethylsilane, trimethylsilane, tetramethylsilane, ethylsilane, diethylsilane, triethylsilane, tetraethylsilane, ethylmethylsilane, triethylmethylsilane, ethyldimethylsilane, ethyltrimethylsilane, diethyldimethylsilane, 1,1,3,3,-tetrahydrido-1,3-disilacyclobutane; 1,3-disilacyclobutane; 1,3-dimethyl-1,3-dihydrido-1,3-disilylcyclobutane; 1,1,3,3, tetramethyl-1,3-disilacyclobutane; 1,1,3,3,5,5-hexahydrido-1,3,5-trisilane; 1,1,3,3,5,5-hexamethyl-1,3,5-trisilane; 1,1,1,4,4,4,-hexahydrido-1,4-disilabutane; and 1,4-bis-trihydrosilyl benzene. Also the corresponding meta substituted isomers, such as dimethyl-1-propyl-3-silabutane; 2-silapropane, 1,3-disilacyclobutane, 1,3-disilapropane, 1,5-disilapentane, or 1,4-bis-trihydrosilyl benzene can be employed.

A single precursor such as silane amine, $Si(Net)_4$, can be used as the silicon, carbon and nitrogen source. Another preferred method is a mixture of precursors, a Si containing source such as silane, disilane, or a alkylsilane such as tetramethylsilane, or trimethylsilane, and a nitrogen containing source such as ammonia, amines, nitriles, aminos, azidos, azos, hydrizos. An additional carbon source and/or carbon and nitrogen containing source comprised of a linear, branched, cyclic or polycyclic hydrocarbon backbone of —$[CH_2]_n$—, where n is greater than or equal to 1, and may be substituted by functional groups selected from alkenes (—C═C—), alkynes (—C≡C—), amines (—C—N—), nitriles (—C≡N), amino (—$NH_2$), azido (—N═N═N—) and azo (—N═N—) may also be required. The hydrocarbon backbone may be linear, branched, or cyclic and may include a mixture of linear branched and cyclic hydrocarbon moieties. These organic groups are well known and have standard definitions that are also well known in the art. These organic groups can be present in any organic compound.

In some embodiments, the method may further include the step of providing a parallel plate reactor, which has an area of a substrate chuck from 85 $cm^2$ to 750 $cm^2$, and a gap between the substrate and a top electrode from 1 cm to 12 cm. A high frequency RF power is applied to one of the electrodes at a frequency from 0.45 MHz to 200 MHz. Optionally, an additional RF power of lower frequency than the first RF power can be applied to one of the electrodes. A single source precursor or a mixture of precursors which provide a silicon, carbon and nitrogen source are introduced into a reactor.

The conditions used for the deposition step may vary depending on the desired final properties of ARC 16. Broadly, the conditions used for providing the ARC 16 comprising elements of Si:C:H:X, include: setting the substrate temperature within a range from 100° C. to 700° C.; setting the high frequency RF power density within a range from 0.1 $W/cm^2$ to 2.0 $W/cm^2$; setting the gas flow rates within a range from 5 seem to 10000 seem, setting the inert carrier gases, such as helium (or/and argon) flow rate within a range from 10 sccm to 10000 seem; setting the reactor pressure within a range from 1 Torr to 10 Torr; and setting the high frequency RF power within a range from 10 W to 1000 W. Optionally, a lower frequency power may be added to the plasma within a range from 10 W to 600 W. When the conductive area of the substrate chuck is changed by a factor of X, the RF power applied to the substrate chuck is also changed by a factor of X. Gas flows of silane, carbon and/or nitrogen gas precursors are flowed into the reactor at a flow rate within a range from 10 seem to 1000 seem. While gas precursors are used in the above example, liquid precursors may also be used for the deposition.

The atomic % ranges for M in such ARC materials are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for C in ARC 16 are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for H in ARC 16 are as follows: preferably 0.1 atomic % to 50 atomic %, more preferably 0.5 atomic % to 50 atomic %, most preferably 1 atomic % to 40 atomic % and most highly preferably 5 atomic % to 30 atomic %. The atomic % ranges for X in ARC 16 are as follows: preferably 0 atomic % to 70 atomic %, more preferably 0.5 atomic % to 70 atomic %, most preferably 1 atomic % to 40 atomic % and most highly preferably 5 atomic % to 30 atomic %.

The ARC 16 including elements of M, C and H may have a tunable index of refraction and extinction coefficient which can be optionally graded along the film thickness to match the optical properties of the substrate and the photoresist to be formed directly on it. Thus, the optical properties and the lithographic features of ARC 16 are superior to those obtained by conventional single layer ARC. The ARC's optical constants are defined here as the index of refraction n and the extinction coefficient k.

The ARC 16 including elements of M, C and H can be deposited also in a parallel plate PECVD reactor with the substrate positioned on the grounded electrode. In some embodiments, ARC 16 can be deposited at a substrate temperature up to 400° C., and in a high-density plasma type reactor under suitable chosen conditions. It should be noted that by changing process parameters such as bias voltage, gas mixture, gas flow, pressure and deposition temperature, the film's optical constants can be changed. In addition, the composition of the starting precursor as well as the introduction of oxygen, nitrogen, fluorine, and sulfur containing precursors also allows the tunability of these films.

In another embodiment, the ARC 16 that is employed is formed by a liquid deposition process including for example, spin-on coating, spray coating, dip coating, brush coating, evaporation or chemical solution deposition. This ARC formed by liquid deposition comprises a polymer that has at least one monomer unit comprising the formula M-$R^A$ wherein M is at least one of the elements of Si, Ge, B, Sn, Fe, Ta, Ti, Ni, Hf and La and $R^A$ is a chromophore. Such an ARC is described in U.S. Patent Publication No. 2009/0081418 the entire content of which is incorporated herein by reference. In some embodiments, M within the monomer unit may also be bonded to organic ligands including elements of C and H, a cross-linking component, another chromophore or mixtures thereof. The organic ligands may further include one of the elements of O, N, S and F. When the organic ligand is bonded to M, it is bonded to M' through C, O, N, S, or F.

In other embodiments, the ARC 16 formed by liquid deposition may also include at least one second monomer unit, in addition to the at least one monomer unit represented by the formula M-$R^A$. When present, the at least one second monomer unit has the formula M'-$R^B$, wherein M' is at least one of the elements of Si, Ge, B, Sn, Fe, Ta, Ti, Ni, Hf and La, and $R^B$ is a cross-linking agent. M and M' may be the same or different elements. In these two formulae, M and M' within the monomer unit may be also be bonded to organic ligands including atoms of C and H, a cross-linking component, a chromophore or mixtures thereof. The organic ligands may further include one of the elements of O, N, S and F. When the organic ligand is bonded to M and M', it is bonded to M or M' through C, O, N, S, or F.

The liquid ARC composition comprising M-R$^A$ or M-R$^A$ and M'-R$^B$ may also comprise at least one additional component, including a separate crosslinker, an acid generator or a solvent. When liquid deposition is employed, the ARC 16 is formed by liquid phase deposition of a liquid composition that includes an inorganic precursor that includes element of M, C and H, wherein M is at least one of the elements of Si, Ge, B, Sn, Fe, Ta, Ti, Ni, Hf and La. The inorganic precursor used in forming the ARC may optionally include elements of O, N, S, F or mixtures thereof. In some embodiments, M is preferably Si. The liquid composition also includes, in addition to the inorganic precursor, a chromophore, a cross-linking component, an acid generator and solvent.

One embodiment of the inorganic ARC 16 composition used in the liquid deposition embodiment comprises M-R$^A$ and M'-R$^B$ units, wherein M and M' are at least one of the elements of Si, Ge, B, Sn, Fe, Ta, Ti, Ni, Hf and La or are selected from Group IIIB to Group VIB, Group IIIA, and Group IVA. The inorganic precursor used in forming the ARC may optionally include elements of O, N, S, F or mixtures thereof. One embodiment of the ARC composition comprises the MO$_y$ unit which can be any one of many different metal-oxide forms. An exemplary list of such metal-oxide forms for a particular metal is as follows: MO$_3$; wherein M is Sc, Y, lanthanide, and Group IIIA; B, Al, Ga or In; MO$_4$; wherein M is Group IVB; Ti, Zr or Hf, and Group IVA; Sn or Ge; MO$_5$; wherein M is Group VB; V, Nb or Ta; or P. The Group VB metals are also known to form stable metal oxo forms, LMO$_3$, wherein L is an oxo; LMO; many of the listed metals form stable acetoacetato-metal complexes; LMO; many of the listed metals form stable cyclopentadienyl-metal complexes; LMO; wherein L is an alkoxy ligand; M is Sc, Y, or lanthanide, Group IVB, and Group VB; or LMO; wherein L is an alkyl or phenyl ligand; M is Group IIIA or Group IVA.

The chromophore, cross-linking component and acid generator that can be used in the liquid deposited ARC are defined in greater detail with respect to the following preferred embodiment of the present invention. In a preferred embodiment, the ARC 16 formed by liquid deposition is characterized by the presence of a silicon-containing polymer having units selected from a siloxane, silane, carbosilane, oxycarbosilane, silsesquioxane, alkyltrialkoxysilane, tetra-alkoxysilane, or silicon-containing and pendant chromophore moieties. The polymer containing these units may be a polymer containing these units in the polymer backbone and/or in pendant groups. Preferably, the polymer contains the preferred units in its backbone. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The polymer should be soluble to form a solution and have film-forming characteristics conducive to forming an ARC by conventional spin-coating. In addition to the chromophore moieties discussed below, the silicon-containing polymer also preferably contains a plurality of reactive sites distributed along the polymer for reaction with the cross-linking component.

Examples of suitable polymers include polymers having the silsesquioxane (ladder, caged, or network) structure. Such polymers preferably contain monomers having structures (I) and (II) below:

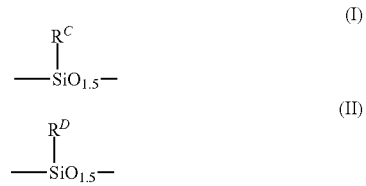

where R$^C$ comprises a chromophore and R$^D$ comprises a reactive site for reaction with the cross-linking component.

Alternatively, general linear organosiloxane polymers containing monomers (I) and (II) can also be used. In some cases, the polymer contains various combinations of monomers (I) and (II) including linear structures such that the average structure for R$^C$-containing monomers may be represented as structure (III) below and the average structure for R$^D$-containing monomers may be represented by structure (IV) below:

where x is from 1 to 1.5. In theory, x may be greater than 1.5, however, such compositions generally do not possess characteristics suitable for spin-coating processes (e.g., they form undesirable gel or precipitate phases).

Generally, silsesquioxane polymers are preferred. If the ordinary organosiloxane polymers are used (e.g., monomers of linear structures (I) and (III)), then preferably, the degree of cross-linking is increased compared to formulations based on silsesquioxanes.

The chromophore-containing groups R$^C$ (or R$^A$ in the generic description above) may contain any suitable chromophore which (i) can be grafted onto the silicon-containing polymer (or M moiety of the generic monomer defined above) (ii) has suitable radiation absorption characteristics at the imaging wavelength, and (iii) does not adversely affect the performance of the layer or any overlying layers.

Preferred chromophore moieties include benzene and its derivatives, chrysenes, pyrenes, fluoranthrenes, anthrones, benzophenones, thioxanthones, and anthracenes. Anthracene derivatives, such as those described in U.S. Pat. No. 4,371, 605 may also be used; the disclosure of this patent is incorporated herein by reference. In one embodiment, phenol, hydroxystyrene, and 9-anthracene methanol are preferred chromophores. The chromophore moiety preferably does not contain nitrogen, except for possibly deactivated amino nitrogen such as in phenol thiazine.

The chromophore moieties may be chemically attached by acid-catalyzed O-alkylation or C-alkylation such as by Friedel-Crafts alkylation. The chromophore moieties may also be chemically attached by hydrosilylation of SiH bond on the parent polymer. Alternatively, the chromophore moiety may be attached by an esterification mechanism. A preferred acid for Friedel-Crafts catalysis is HCl.

Preferably, 15 to 40% of the functional groups contain chromophore moieties. In some instances, it may be possible to bond the chromophore to the monomer before formation of the silicon-containing polymer. The site for attachment of the chromophore is preferably an aromatic group such as a hydroxybenzyl or hydroxymethylbenzyl group. Alternatively, the chromophore may be attached by reaction with other moieties such as cyclohexanol or other alcohols. The reaction to attach the chromophore is preferably an esterification of the alcoholic OH group.

$R^D$ (or $R^B$ in the generic description above) comprises a reactive site for reaction with a cross-linking component. Preferred reactive moieties contained in $R^D$ are alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides may be used.

Preferably, the silicon-containing polymer (before attachment of the chromophore) of a liquid deposited ARC 16 is poly(4-hydroxybenzylsilsesquioxane). Examples of other silsesquioxane polymers include: poly(p-hydroxyphenylethylsilsesquioxane), poly(p-hydroxyphenylethylsilsesquioxane-co-p-hydroxy-alpha-methylbenzylsilsesquioxane), poly(p-hydroxyphenylethylsilsesquioxane-co-methoxybenzylsilsesquioxane), poly(p-hydroxyphenylethylsilsesquioxane-co-t-butylsilsesquioxane), poly(p-hydroxyphenylethylsilsesquioxane-co-cyclohexylsilsesquioxane), poly(p-hydroxyphenylethylsilsesquioxane-co-phenylsilsesquioxane), poly(p-hydroxyphenylethylsilsesquioxane-co-bicycloheptylsilsesquioxane), poly(p-hydroxy-alpha-methylbenzylsilsesquioxane), poly(p-hydroxy-alpha-methylbenzylsilsesquioxane-co-p-hydroxybenzylsilsesquioxane), poly(p-hydroxy-alpha-methylbenzylsilsesquioxane-co-methoxybenzylsilsesquioxane), poly(p-hydroxy-alpha-methylbenzylsilsesquioxane-co-t-butylsilsesquioxane), poly(p-hydroxy-alpha-methylbenzylsilsesquioxane-co-cyclohexylsilsesquioxane), poly(p-hydroxy-alpha-methylbenzylsilsesquioxane-co-phenylsilsesquioxane), poly(p-hydroxy-alpha-methylbenzylsilsesquioxane-co-bicycloheptylsilsesquioxane), poly(p-hydroxybenzylsilsesquioxane-co-p-hydroxyphenylethylsilsesquioxane), and poly(p-hydroxy-alpha-methylbenzylsilsesquioxane-co-alpha-methylbenzylsilsesquioxane).

The Si containing polymers that can be used in a liquid deposited ARC 16 preferably have a weight average molecular weight, before reaction with the cross-linking component, of at least 1000, more preferably a weight average molecular weight of 1000-10000.

The cross-linking component of the liquid deposited ARC 16 is preferably a crosslinker that can be reacted with an SiO containing polymer in a manner which is catalyzed by generated acid and/or by heating. This cross-linking component can be inorganic or organic in nature. It can be a small compound (as compared with a polymer or copolymer) or a polymer, a copolymer, or a blend including at least two of any combination of polymers and/or copolymers, wherein the polymers include one monomer and the copolymers include at least two monomers. Generally, the cross-linking component used in the liquid deposited antireflective coating compositions may be any suitable cross-linking agent known in the negative photoresist art which is otherwise compatible with the other selected components of the composition. The cross-linking agents preferably act to crosslink the polymer component in the presence of a generated acid. Preferred cross-linking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible cross-linking agents include: 2,6-bis(hydroxymethyl)-p-cresol, compounds having the following structures:

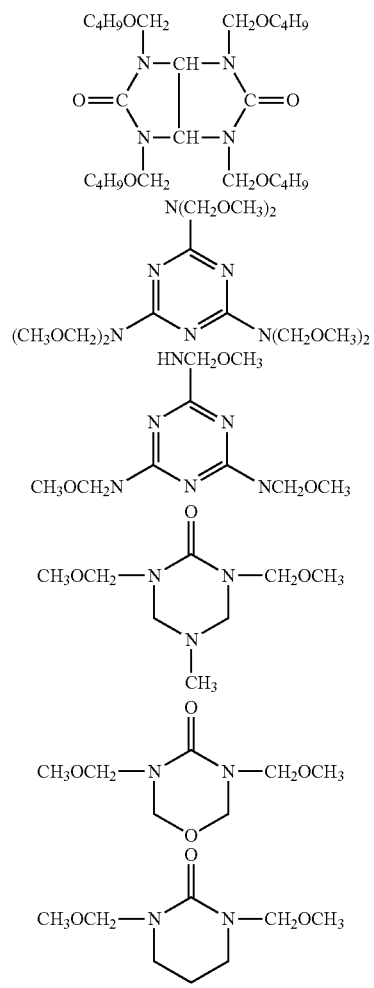

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent. No. 1 204 547. Other cross-linking agents such as bis-epoxies or bis-phenols (e.g., bisphenol-A) may also be used. Combinations of cross-linking agents may be used. The cross-linking component may be chemically bonded to the Si containing polymer backbone.

In another embodiment, the cross-linking component is a silicon-containing polymer having at least one unit selected from a siloxane, silane, carbosilane, oxycarbosilane, silsesquioxane, alkyltrialkoxysilane, and tetra-alkoxysilane. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The acid generator used in the liquid deposited ARC composition is preferably an acid generator compound that liberates acid upon thermal treatment. A variety of known thermal acid generators are suitably employed such as, for example, 2,4,4,6-tetrabromocyclohexadienone, benzoin tosylate, 2-nitrobenzyl tosylate and other alkyl esters of organic sulfonic acids, blocked alkyl phosphoric acids, blocked perfluoroalkyl sulfonic acids, alkyl phosphoric acid/amine complexes, perfluoroalkyl acid quats wherein the blocking can be by covalent bonds, amine and quaternary ammonium. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939, 236. Other radiation-sensitive acid generators known in the resist art may also be used as long as they are compatible with the other components of the antireflective composition. Where a radiation-sensitive acid generator is used, the cure (cross-linking) temperature of the composition may be reduced by application of appropriate radiation to induce acid generation which in turn catalyzes the cross-linking reaction. Even if a radiation-sensitive acid generator is used, it is preferred to thermally treat the composition to accelerate the cross-linking process (e.g., for wafers in a production line).

The antireflective coating compositions used in the liquid deposition process preferably contain (on a solids basis) in a suitable solvent commonly known to those skilled in the art (i) from 10 wt % to 98 wt. % of a polymer including M, more preferably from 70 wt. % to 80 wt. %, (ii) from 1 wt % to 80 wt. % of cross-linking component, more preferably from 3 wt. % to 25%, most preferably from 5 wt. % to 25 wt. %, and (iii) from 1 wt. % to 20 wt. % acid generator, more preferably 1 wt. % to 15 wt. %.

After liquid depositing the ARC 16, a post deposition baking step is typically, but not necessarily always, used to remove unwanted components, such as solvent, and to effect crosslinking. When performed, the baking step is conducted at a temperature from 60° C. to 400° C., with a baking temperature from 80° C. to 300° C. being even more preferred. The duration of the baking step varies and is not critical to the practice of the present invention. The baked and previously liquid deposited ARC 16 may further undergo a post curing treatment process. This post curing treatment may include one of the post treatments used above for dielectric cap 14. As such, the various post treatments and conditions used above in treating the dielectric cap 14 are incorporated herein by reference.

In addition, the composition of the starting precursor used in liquid deposition as well as the introduction of oxygen, nitrogen, fluorine containing precursors also allows the tunability of these films. In either embodiment mentioned above, the ARC's optical constants are defined here as the index of refraction n and the extinction coefficient k. In general, ARC 16 can be modeled so as to find optimum optical parameters (n and k values) of ARC as well as optimum thickness. The preferred optical constants of the ARC 16 are in the range from n=1.4 to n=2.6 and k=0.01 to k=0.78 at a wavelength of 248, 193 and 157, 126 nm and extreme ultraviolet (13.4 nm) radiation.

In addition to the above, ARC 16 in any embodiment does not interact with the photoresist to induce residue, footing or undercutting. Moreover, ARC 16 has good etch selectivity to the cured patterned dielectric element-containing photoresist. Etch selectivities of 1.5-4 to 1 of the ARC 16 to the cured patterned dielectric element-containing photoresist can be obtained. Furthermore, the use of the ARC 16 of described above (vapor or liquid deposited) maintains the pattern and structural integrity after curing of the patterned dielectric element-containing photoresist. This is critical as ARC layer 16 is retained as a permanent part of the final interconnect stack.

In some embodiments of the invention, the optional dielectric layer 14 and the ARC 16 can be combined into a graded cap that includes properties of both a dielectric cap layer and an ARC. Such a graded cap includes at least a lower region that includes elements of a dielectric cap and an upper region that includes elements of an ARC. The graded cap can be formed utilizing any of the methods mentioned above in forming the dielectric cap and/or ARC.

Figure 2:
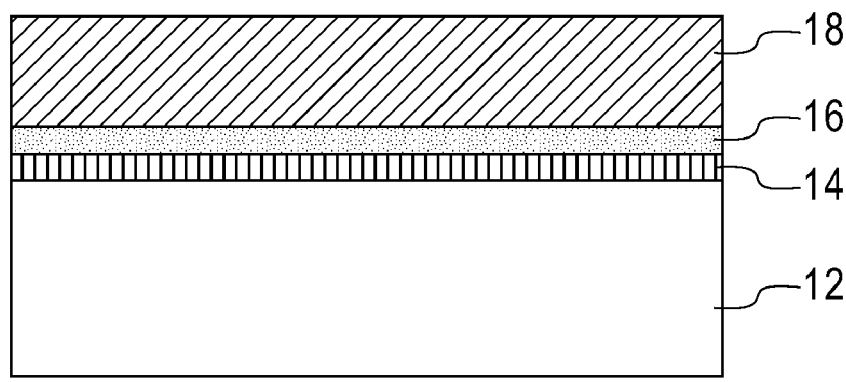
FIG. 2 is a pictorial representation (through a cross sectional view) illustrating the initial structure of FIG. 1 after forming a photoresist on an upper surface of the initial structure.

Referring now to FIG. 2, there is illustrated a photoresist 18 that is formed on an upper surface of the initial structure 10 shown in FIG. 1. That is, the photoresist 18 can be formed atop any of substrate 12, dielectric cap 14 or ARC 16. The photoresist 18 is provided (i.e., formed) utilizing a deposition process including, for example, spin-on-coating, dip coating, brush coating, blade coating, and ink jet dispensing. After applying the photoresist 18, a post deposition baking step is typically, but not necessarily always, employed to remove unwanted components, such as solvent. When performed, the baking step can be conducted at a temperature from 40° C. to 200° C., with a baking temperature from 60° C. to 140° C. being more preferred. The duration of the baking step varies from 10 seconds to 600 seconds and is not critical herein.

The thickness of the photoresist 18 may vary depending on the requirement of the chip and the technique used to form the same as well as the material make-up of the photoresist. Typically, the photoresist 18 has a thickness from 1 nm to 50000 nm, with a thickness from 20 nm to 5000 nm being more typical.

The photoresist 18 can include any material that can be imaged or patterned utilizing photolithography and which can be converted into a permanent dielectric material by incorporating at least one dielectric enabling element therein and by a subsequent cure process. Illustrative examples of photoresists that can be employed include, but are not limited to, a positive-tone photoresist material, a negative-tone photoresist material, a photo-patternable low-k (PPLK) material or any combination thereof provided that it offers the ability to selectively incorporate at least one dielectric enabling element into an area where there is only photoresist. These photoresist may be chemically amplified photoresists or non-chemically amplified photoresists. They can be organic photoresists or inorganic photoresists. They may also be any material suitable for other patterning methods, including direct write patterning, contact printing, such as nanoimprintning, scanning probe lithography and the like.

The chemically amplified positive- and negative-tone photoresists include any conventional material that is well known those skilled in the art of photolithography. In general terms, the chemically amplified positive-tone photoresists are photoimageable compositions comprising a polymer (or small molecular in molecular resists), a photoacid generator, and a solvent. Optionally a base may be included.

The polymer (or small molecule compound) is a base soluble polymer and small compound whose functional groups, such as —OH, is protected by an acid sensitive functional group. During pattern-wise exposure and post exposure process, this protecting group undergoes an acid catalyzed de-protection process in the exposed region. Subsequent development in a developer, usually an aqueous base solution, generates a positive-tone relief image. Suitable polymers for chemically amplified positive-tone photoresists include polymers and copolymers of at least two monomers selective from organic monomers, including hydroxystyrene and its derivatives, acrylate and its derivatives, methacrylate and its derivatives, norbornene and its derivatives, and inorganic monomers, including a siloxane, silane, carbosilane, oxycarbosilane, and silsesquioxane.

The extent of protection and the amount of co-monomer present are such that the chemically amplified positive-tone composition will provide good lithography performance, i.e., high resolution and a good process window. Examples of protecting groups which can be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed in the present invention include, but are not limited to phenolic carbonates; t-alkoxycarbonyloxys such as t-butoxylcarbonyloxy and isopropyloxycarbonyloxy. A highly preferred carbonate is t-butoxylcarbonyloxy.

Some examples of cyclic and branched ethers that may be employed in the present invention include, but are not limited to benzyl ether and t-alkyl ethers such t-butyl ether. Of the aforesaid ethers, it is highly preferred to use t-butyl ether.

Examples of cyclic and branched esters that can be employed in the present invention are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butylrolactonyl ester, bis(trimethylsilyl)isopropyl ester, trimethylsilylethyl ester, tris(trimethylsilyl)silylethyl ester and cumyl ester.

Some examples of acetals and ketals that can be employed in the present invention include, but are not limited to phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed.

Illustrative examples of silylethers that can be employed in the present invention include, but are not limited to trimethylsilylether, dimethylethylsilylether and dimethylpropylsilylether. Of these silylethers, it is preferred that trimethylsilylether be employed.

The chemically amplified negative-tone photoresists are photoimageable compositions comprising a polymer (or small molecular in molecular resists), a crosslinking agent, a photoacid generator, and a solvent. Optionally, a base may be included.

The polymer (or small molecule compound) is a base soluble polymer and small compound whose functional groups, such as —OH, can undergo an acid catalyzed crosslinking reaction. During pattern-wise exposure and post exposure baking process, this functional group undergoes an acid catalyzed crosslinking reaction in the exposed region. Subsequent development in a developer, usually an aqueous base solution, generates a negative relief image. Suitable polymers for chemically amplified negative-tone photoresists include polymers and copolymers of at least two monomers selective from organic monomers, including hydroxystyrene and its derivatives, acrylate and its derivatives, methacrylate and its derivatives, norbornene and its derivatives, and inorganic monomers, including a siloxane, silane, carbosilane, oxycarbosilane, silsesquioxane, The term "photo-patternable low-k (PPLK) material" includes a functionalized polymer, copolymer or blend including at least two of any combination of polymers and/or copolymers having one or more acid-sensitive imageable groups. The PPLK material acts as a photoresist and after curing it is converted into a dielectric material having a dielectric constant of about 4.3, or less. It is noted that when the PPLK material is comprised of a polymer, the polymer includes at least one monomer (to be described in greater detail below). When the PPLK material is comprised of a copolymer, the copolymer includes at least two monomers (to be described in greater detail below). The blends of polymers and/or copolymers include at least two of any combination of polymers and/or copolymers described below.

In general terms, the PPLK material that can be employed as photoresist 18 is a patternable composition comprising a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the PPLK material that can be employed as photoresist 18 is a pattemable composition comprising a photo/acid-sensitive polymer of one monomer or a copolymer of at least two monomers selected from siloxane, silane, carbosilane, oxycarbosilane, organosilicates, silsesquioxanes and the like. The PPLK material may also be patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the PPLK material may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally the PPLK material may be patternable composition further comprising at least one microscopic pore generator (porogen). The pore generator may be or may not be photo/acid sensitive.

Illustrative polymers for the PPLK material include, but are not limited to, siloxane, silane, carbosilane, oxycarbosilane, silsesquioxane-type polymers including caged, linear, branched or combinations thereof In one embodiment, the imageable inter-level dielectric is a pattemable composition comprising a blend of these photo/acid-sensitive polymers. Examples of PPLK materials that can be employed in this application are disclosed, for example, in U.S. Pat. Nos. 7,041,748, 7,056,840, and 6,087,064, as well as U.S. Patent Application Publication No. 2008/0286467, U.S. Patent Application Publication No. 2009/0233226, U.S. patent application Ser. No. 12/126,287, filed May 23, 2008, U.S. patent application Ser. No. 12/569,200, filed Sep. 29, 2009 all of which are incorporated herein by reference in their entirety.

The PPLK material is formed from a patternable composition (negative-tone or positive-tone) that includes at least one of the above mentioned polymers, copolymers or blends, a photoacid generator, a base additive and a solvent typically used in a photoresist composition. When the PPLK material is a negative-tone patternable material, it may be formed from a pattemable composition optionally including an additional cross-linker. This additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the PPLK material is a positive-tone patternable material, it is formed from a patternable composition that includes at least one of the above mentioned polymers, copolymers or blends, a photoacid generator, a base additive and a solvent typically used in a photoresists. The photoacid generators, base additives and solvents are well known to those skilled in the art and, as such, details regarding those components are not fully provided.

Figure 3:
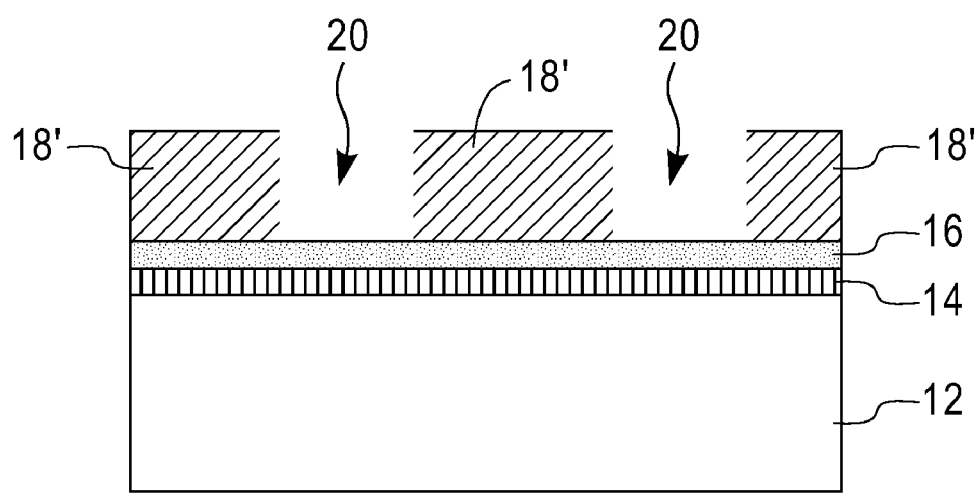
FIG. 3 is a pictorial representation (through a cross sectional view) illustrating the structure of FIG. 2 after forming at least one interconnect pattern into the photoresist.

Referring now to FIG. 3, there is illustrated the structure of FIG. 2 after forming a patterned photoresist 18' that includes at least one interconnect pattern 20 present therein. The at least one interconnect pattern 20 can be at least one via opening (as shown and as preferred) or at least one line opening (not shown and less preferred than forming a via opening at this stage of the inventive method). The at least one interconnect pattern 20 exposes a surface of an underlying material of the initial structure 10. That is, the at least one interconnect pattern 20 can expose a surface of ARC 16, dielectric cap 14 or substrate 12.

The at least one interconnect pattern 20 is formed within the photoresist 18 by subjecting photoresist 18 to a pattern-wise exposure step that forms latent images of a desired circuitry. An optional post-exposure baking may be required to effect the photochemical reactions. When performed, the baking step is conducted at a temperature from 60° to 200° C., with a baking temperature from 80° to 140° C. being more preferred. The duration of the baking step varies and is not critical to the practice of the present invention. After exposure and post-exposure baking, the latent images are developed with an appropriate developer, usually an aqueous base solution, such as 0.26N tetramethylammoniahydroxide (TMAH) solution.

The pattern wise exposing process can be accomplished in a variety of ways, including, for example, through a mask with a lithography stepper or a scanner with an exposure light source of G-line, I-line (365 nm), DUV (248 nm, 193 nm, 157 nm, 126 nm), Extreme UV (13.4 nm), or an electron beam, an ion beam. The exposing process may be performed in a dry mode or an immersion mode. The pattern-wise exposing process also includes direct writing without the use of a mask with, for example, light, electron beam, ion beam, and scanning probe lithography. Other patterning techniques that can be used include contact printing techniques such as nanoimprint lithography, embroising, micro contact printing, replica molding, microtransfer molding, micromolding in capillaries and solvent-assisted micromolding, thermal assisted embroising, inject printing, and the like.

Figure 4:
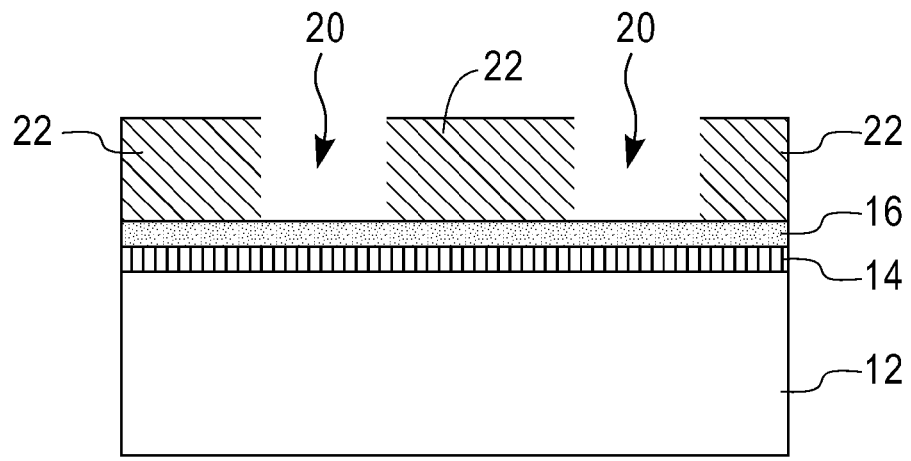
FIG. 4 is a pictorial representation (through a cross sectional view) illustrating the structure of FIG. 3 after incorporating at least one dielectric enabling element into the patterned photoresist.

Referring to FIG. 4, there is shown the structure of FIG. 3 after incorporating at least one dielectric element enabling element within the patterned photoresist 18'. In FIG. 4, reference numeral 22 denotes the patterned photoresist including the at least one dielectric enabling element contained therein. The at least one dielectric enabling element that can be used includes any element that can convert a patterned photoresist into a permanent patterned dielectric material after performing a subsequent curing step. Dielectric enabling elements that can be employed include, but are not limited to, silicon, titanium, germanium and the like. The at least one dielectric enabling element is typically introduced as a precursor into the patterned photoresist 18' via permeation in the form of a metal oxide. Examples of silica precursors include, but are not limited to, siloxanes, halosilanes, alkoxysilanes, carbosilanes, and silsesquioxane. The incorporation of the at least one dielectric enabling element should be conducted such that the patterned photoresist 18' maintains its pattern integrity. In other words, the pattern type, size and profile are similar or close to the original photoresist patterns.

In one preferred embodiment, silicon is introduced into the patterned photoresist 18' utilizing a silylation process. This silylation process can be performed in a gas phase or a liquid phase. The silylation temperature can range from room temperature to 450° C., preferably 40° C. to 250° C., more preferably 60° C. to 140° C. The silylation duration ranges from 10 seconds to 240 mins, preferably 30 seconds to 10 mins, more preferably 1 min to 4 mins. Silylation agents similar to other silylation processes used in the semiconductor fabrication and which are well known to those skilled in the art can be employed. Typical silylation agents include silane, halosilane, alkosilane, and the like. The silylation process should be conducted such that the patterned photoresist 18' maintain its pattern integrity.

In one embodiment, the incorporation of the at least one dielectric enabling element includes using a catalyst, such as an acid, a base, a photoacid or photobase to promote the incorporation of the at least one dielectric enabling element into the patterned photoresist 18'.

In yet another embodiment, the incorporation of the at least one dielectric enabling element includes using a reaction agent, such as water, or a reaction medium, such as supercritical fluid, to promote the incorporation of the least one dielectric enabling element into the patterned photoresist 18'.

Figure 5:
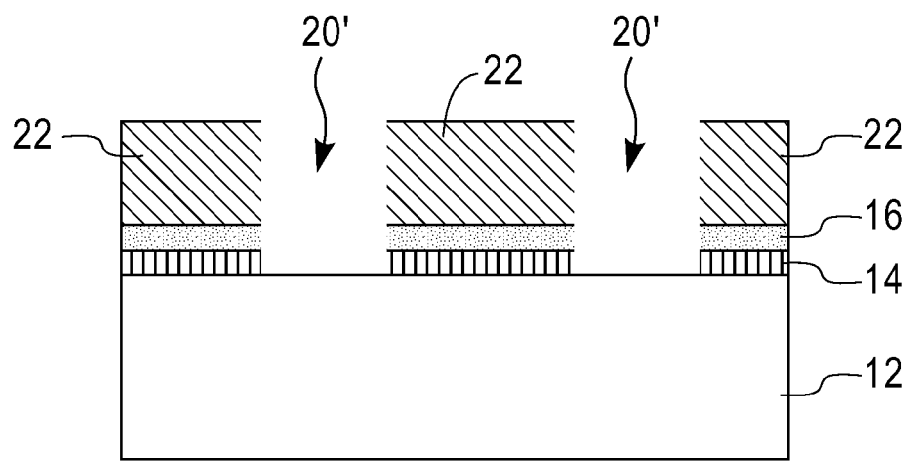
FIG. 5 is a pictorial representation (through a cross sectional view) illustrating the structure of FIG. 4 after an optional step of transferring the pattern of the first permanent patterned dielectric material into underlying layers that are present within the initial structure.
Figure 6:
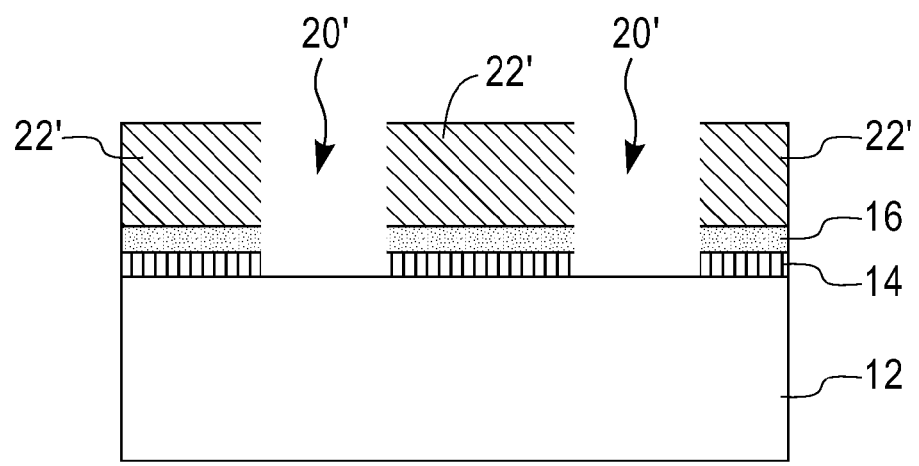
FIG. 6 is a pictorial representation (through a cross sectional view) illustrating the structure of FIG. 5 after curing the patterned photoresist having at least one dielectric enabling element therein.

Referring now to FIG. 5, there is shown the structure of FIG. 4 after optionally transferring the at least one interconnect pattern 20 from the patterned photoresist including the dielectric enabling element incorporated therein through ARC 16 and/or dielectric cap 14. In some embodiments, this step may be performed after curing. In FIG. 6, reference numeral 20' denotes the extended interconnect pattern that is formed in this step. The transfer of the pattern from the patterned photoresist including the at least one dielectric enabling element incorporated therein into ARC 16 and/or dielectric cap 14 can be performed utilizing dry etching and/or wet etching. Dry etching includes the use of one of reactive ion etching, plasma etching, ion beam etching, cluster gas ion etching and laser ablation. Chemical etching utilizing a chemical etchant that selectively removes the exposed portions of ARC 16 and/or dielectric cap 14 relative to the patterned photoresist including the at least one dielectric enabling element incorporated therein. In one embodiment, the interconnect pattern of the patterned photoresist including at least one dielectric enabling element is maintained after the transfer of the pattern into the through ARC 16 and/or dielectric cap 14.

Referring now to FIG. 6, there is shown the structure of FIG. 5 after curing the patterned photoresist including the at least one dielectric enabling element incorporated therein into a cured permanent patterned dielectric material 22'. In some embodiments (not shown), this cure step can be performed prior to the opening of the ARC 16 and/or dielectric cap 14. In yet another embodiment (not shown), a cure step can be performed prior to opening the ARC 16 and/or dielectric cap 14 and after the opening of the ARC 16 and/or dielectric cap 14. In one embodiment, the interconnect pattern integrity of the patterned photoresist including at least one dielectric enabling element is maintained after the cure process.

In any of the aforementioned embodiments, curing is performed by a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it coverts the patterned photoresist including the at least one dielectric enabling element incorporated therein into a cured material that maintains pattern fidelity. The cured product of the patterned photoresist including the at least one dielectric enabling element incorporated therein is a cured and patterned dielectric material that has a dielectric constant of 4.3 or less, with a dielectric constant of less than 3.5 being more typical.

In one embodiment, the irradiation cure step is performed by a combination of a thermal cure and an ultra-violet (UV) cure wherein the wavelength of the ultra-violet (UV) light is from 50 to 300 nm and the light source for the ultra-violet (UV) cure is a UV lamp, an excimer (exciplex) laser or a combination thereof. The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 to 300 nm. Additionally, the light of the ultra-violet (UV) cure may be enhanced and/or diffused with a lens or other optical diffusing device known to those skilled in the art.

In another embodiment, this post patterning cure is a combined UV/thermal cure. This combined UV/thermal cure is carried on a UV/thermal cure module under vacuum or inert atmosphere, such as $N_2$, He, Ar. Typically, the UV/thermal cure temperature is from 100° C. to 500° C., with a cure temperature from 300° to 450° C. being more typical. The duration of the UV/thermal cure is from 0.5 min to 30 min with a duration from 1 to 10 min being more typical. The UV cure module is designed to have a very low oxygen content to avoid degradation of the resultant dielectric materials. This post-patterning cure, if performed, may be in different or the same tool cluster as that of the patterning step.

Figure 7:
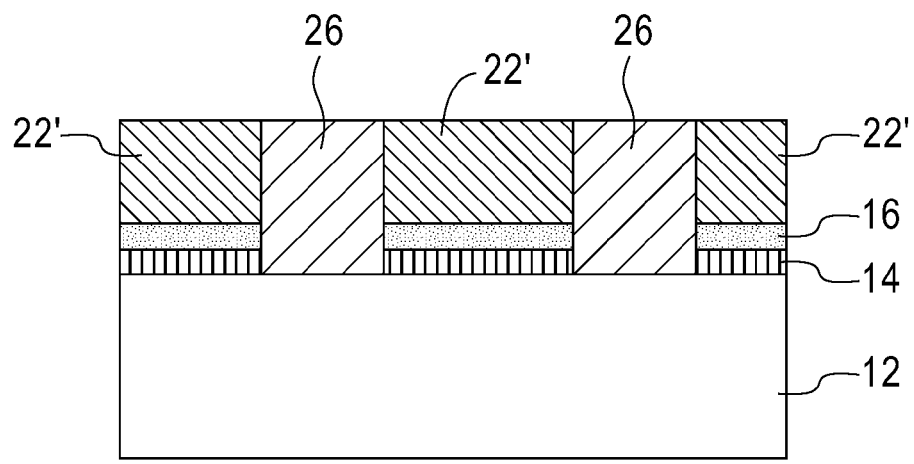
FIG. 7 is a pictorial representation (through a cross sectional view) illustrating the structure of FIG. 6 after filling the at least one interconnect pattern within the cured permanent patterned dielectric material with an electrically conductive material and planarization.

Referring to FIG. 7, there is illustrated the structure of FIG. 6 after filling the at least one extended interconnect pattern 20' with an electrically conductive material 26 and planarization. In some embodiments, a diffusion barrier (not shown), which may comprise Ta, TaN, Ti, TiN, Ru, RuTaN, RuTa, W, WN or any other material that can serve as a barrier to prevent electrically conductive material from diffusing through, is typically formed into the at least one interconnect pattern 20 prior to filling the same with the electrically conductive material 26. The diffusion barrier can be formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier may comprise a combination of layers. The thickness of the diffusion barrier may vary depending on the exact means of the deposition process employed as well as the material and number of layers employed. Typically, the diffusion barrier has a thickness from 4 to 40 nm, with a thickness from 7 to 20 nm being more typical.

Following the formation of the diffusion barrier, the remaining region of the at least one extended interconnect pattern 20' is filled with an electrically conductive material 26 forming a conductive feature. The electrically conductive material 26 used in forming the conductive feature includes, for example, polySi, an electrically conductive metal, an alloy comprising at least one electrically conductive metal, an electrically conductive metal silicide, an electrically conductive nanotube or nanowire, graphene or combinations thereof. Preferably, the electrically conductive material 26 that is used in forming the conductive feature is a conductive metal such as Cu, W or Al, with Cu or a Cu alloy (such as AlCu) being highly preferred in the present invention. The electrically conductive material 26 is filled into the remaining at least one interconnect pattern utilizing a conventional deposition process including, but not limited to, CVD, PECVD, sputtering, chemical solution deposition or plating. A preferred filling method is electrochemical plating.

After deposition, a conventional planarization process such as, for example, chemical mechanical polishing (CMP) can be used to provide a structure in which the diffusion barrier layer and the electrically conductive material 26 each have an upper surface that is substantially coplanar with the upper surface of the cured permanent patterned dielectric material 22'. The resultant structure after filling the interconnect patterns and planarization is shown, for example, in FIG. 7.

A dielectric cap such as described above can be formed atop the structure shown in FIG. 7.

It is noted that the cured permanent patterned dielectric material 22' is a cured product of the patterned photoresist that includes the dielectric enabling element therein. It is also noted that the cured patterned dielectric material 22' is different from the patterned photoresist 18 in chemical composition, physical, electrical and mechanical properties. Moreover, the cured patterned dielectric materials 22' serve as a permanent on-chip dielectric.

It is observed that the above description that relates to FIGS. 1-7 illustrate one embodiment of the invention in which a single damascene interconnect structure is formed. The following description which refers to FIGS. 8-14 illustrates another embodiment of the invention in which a dual damascene interconnect structure is formed. This embodiment begins by first providing the structure shown in FIG. 2. Next, and referring to FIG. 8, there is shown the structure of FIG. 2 after forming at least one first interconnect pattern 50 within photoresist 18, which represents a first photoresist for this embodiment of the invention. The at least one first interconnect pattern 50 includes one of the openings mentioned above for the at least one interconnect pattern 20 and the at least one interconnect pattern 50 can be formed as described above for forming interconnect pattern 20 shown in FIG. 3.

In some embodiments of the present invention the first interconnect pattern 50 is frozen within the first patterned photoresist by performing a curing step. Curing can be performed as described above. In yet another embodiment, no freezing step is performed.

In a further embodiment of the invention (not shown), at least one dielectric enabling element can be incorporated into the patterned photoresist 18' at this point of the invention. Curing can be performed prior to or after forming the second patterned photoresist.

Figure 8:
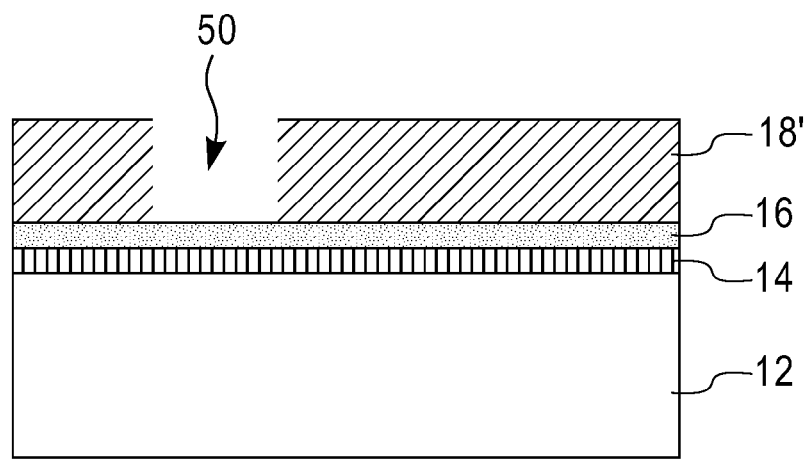
FIG. 8 is a pictorial representation (through a cross sectional view) illustrating the structure of FIG. 2 after forming a first interconnect pattern within the photoresist in accordance with another embodiment of the invention.
Figure 9:
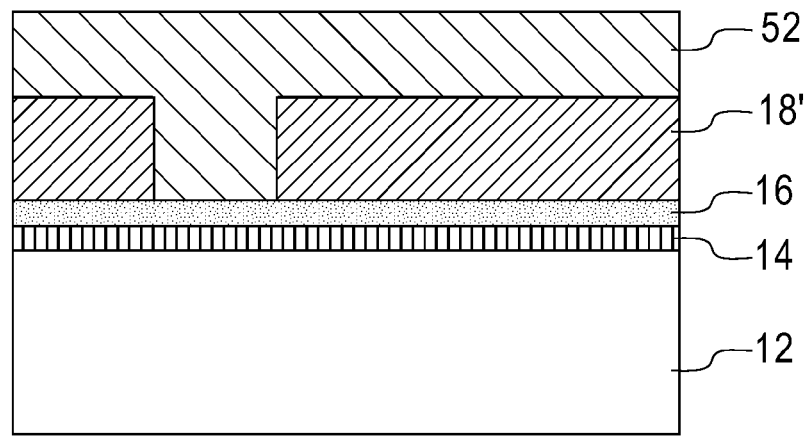
FIG. 9 is a pictorial representation (through a cross sectional view) illustrating the structure of FIG. 8 after forming a second photoresist thereon.

Referring back to the embodiment illustrated in FIG. 8, a second photoresist 52 is formed providing the structure shown in FIG. 9. In FIG. 9, the second photoresist 52 is formed within the at least one first interconnect pattern 20 and extends onto an upper surface of the first photoresist 18. The second photoresist 52 can comprise the same or different material as the first photoresist 18. In general terms, the nature, the composition, and method of formulation mentioned above for the first photoresist 18 are each applicable here for the second photoresist 52. The deposition processes and thickness mentioned above for the first photoresist 18 are also each applicable here for the second photoresist 52. Typically, and in the embodiment illustrated, the first photoreist 18 or the second photoresist 52 is either a negative-tone or a positive-tone material.

Figure 10:
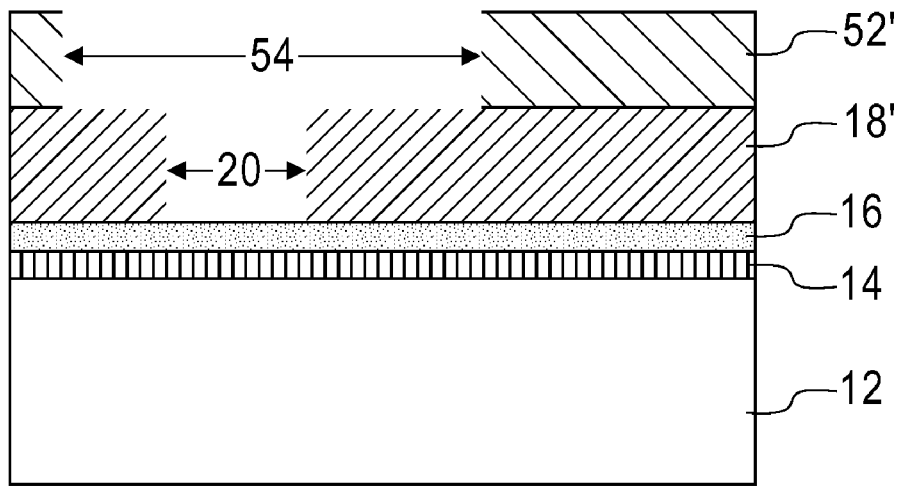
FIG. 10 is a pictorial representation (through a cross sectional view) illustrating the structure of FIG. 8 after forming a second interconnect pattern within the second photoresist.

Referring now to FIG. 10, there is illustrated the structure of FIG. 9 after forming at least one second interconnect pattern 54 within the second photoresist 52. The patterning of the second photoresist 52 into patterned second photoresist 52' is performed utilizing the same basic processing equipment, steps and conditions as those used for patterning the first photoresist 18. In the illustrated embodiment, the second interconnect pattern 54 is typically a line (trench). The via pattern formed within the first photoresist 18 and subsequently filled when the second photoresist 52 is also recovered. The second interconnect pattern 54 may also be a via, when the first interconnect pattern 20 is a line.

Figure 11:
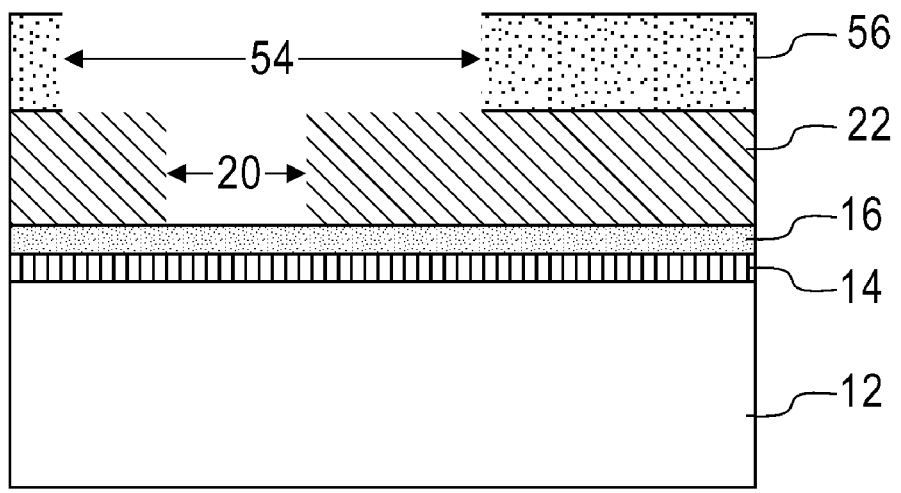
FIG. 11 is a pictorial representation (through a cross sectional view) illustrating the structure of FIG. 10 after converting the patterned first photoresist and the patterned second photoresist into permanent patterned first and second dielectric materials.

Referring now to FIG. 11, there is illustrated the structure of FIG. 10 after incorporating at least one dielectric enabling element into both the patterned first and second photoresists. In some embodiments and when the patterned first photoresist already includes the at least one dielectric element, the at least one dielectric element is incorporated only into the second patterned photoresist.

Referring back to FIG. 11, reference numeral 22 denotes the first patterned photoresist that includes the at least one dielectric enabling element incorporated therein, while reference numeral 56 denotes the second patterned photoresist including the at least one dielectric enabling element incorporated therein. The at least one dielectric enabling element includes one of the materials mentioned in the first embodiment and it is formed into the patterned photoresist using one of the techniques and precursors mentioned above.

Figure 12:
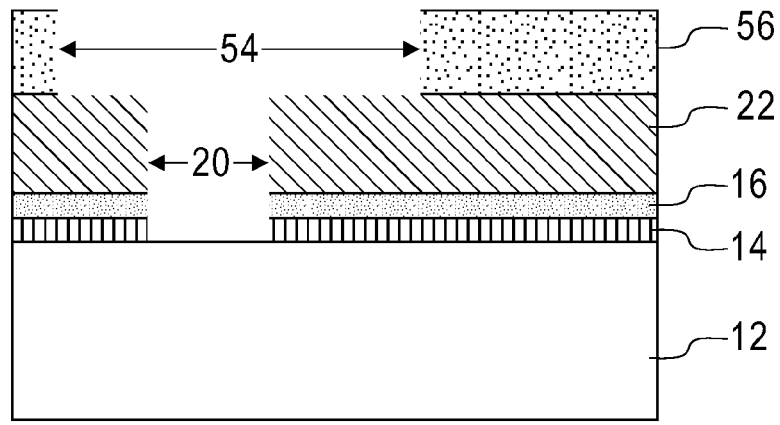
FIG. 12 is a pictorial representation (through a cross sectional view) illustrating the structure of FIG. 11 after optionally transferring the first interconnect pattern from the first permanent patterned dielectric material into underlying layers of the initial structure.

Referring now to FIG. 12, there is shown the structure of FIG. 11 after optionally transferring the first pattern within the permanent first patterned dielectric material 22 into the ARC 16 and/or dielectric cap 14. The pattern transfer into ARC 16 and/or dielectric cap 14 is achieved utilizing one of the etching steps mentioned above in the first embodiment.

Figure 13:
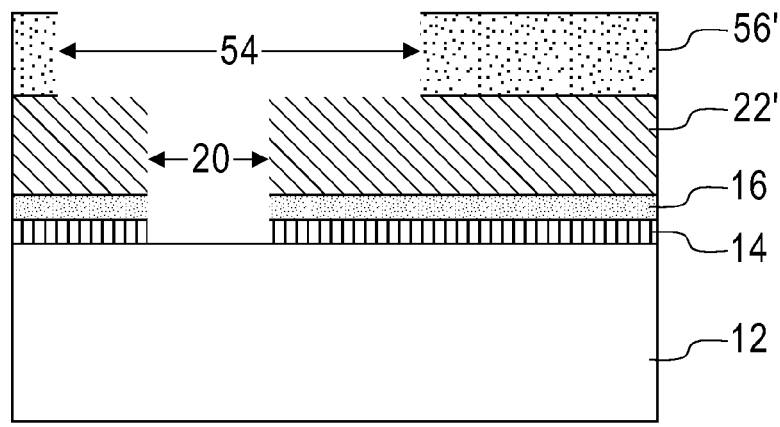
FIG. 13 is a pictorial representation (through a cross sectional view) illustrating the structure of FIG. 12 after performing a curing step.

Referring now to FIG. 13, there is shown the structure of FIG. 12 after a curing step is performed. In some embodiments (not shown), this cure step can be performed prior to the opening of the ARC 16 and/or dielectric cap 14. In yet another embodiment (not shown), a cure step can be performed prior to opening the ARC 16 and/or dielectric cap 14 and after the opening of the ARC 16 and/or dielectric cap 14. The curing step converts patterned photoresists containing the at least one dielectric enabling element into the permanent patterned dielectric material. The cured products of the first and second patterned photoresists containing the at least one dielectric material are labeled as elements 22' and 56', respectively within FIG. 13. The curing includes one of the curing processes mentioned above in the first embodiment of the invention.

Figure 14:
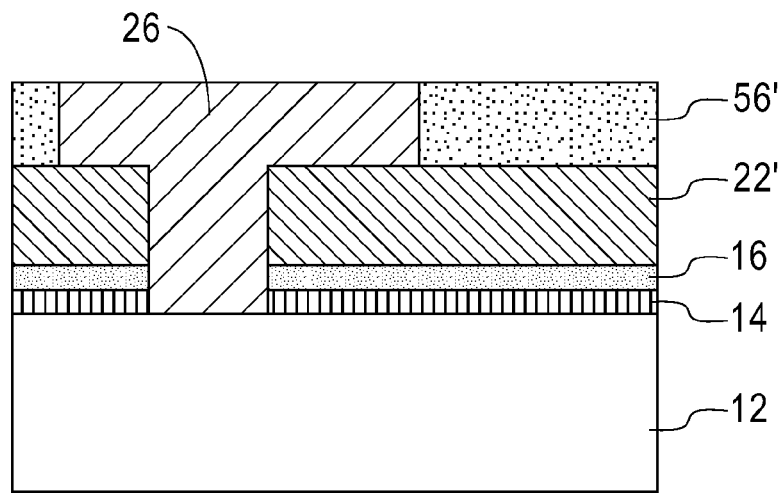
FIG. 14 is a pictorial representation (through a cross sectional view) illustrating the structure of FIG. 13 after filling the interconnect patterns within the cured permanent patterned first and second dielectric materials with an electrically conductive material and planarization.

Referring now to FIG. 14, there is shown the structure of FIG. 13 after filling the interconnect patterns within at least dielectric materials 22' and 56' with an electrically conductive material 26 and planarization. The processing and materials used in forming the structure shown in FIG. 14 are identical to those mentioned above in forming the structure shown in FIG. 7 of the first embodiment of the invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
   providing at least one photoresist to an upper surface of a substrate;
   forming at least one interconnect pattern into the at least one photoresist providing a patterned photoresist;
   adding at least one dielectric enabling element into the patterned photoresist; and
   curing the patterned photoresist containing the at least one dielectric enabling element into a cured permanent patterned dielectric material.

2. The method of claim 1 wherein the at least one photoresist includes a positive-tone photoresist, a negative-tone photoresist, an imageable inter-level dielectric or any combination thereof.

3. The method of claim 1 wherein said substrate includes an antireflective coating and said at least one photoresist is formed on an upper surface of the antireflective coating.

4. The method of claim 1 wherein said forming at least one interconnect pattern includes G-line exposure, I-line exposure, DUV exposure, EUV exposure, direct write patterning, imprint contact printing, inkjet printing, screen printing and multi-patterning lithography.

5. The method of claim 1 wherein the at least one dielectric enabling element is an inorganic element selected from Si, Ge Ta and Ti.

6. The method of claim 1 wherein said adding the at least one dielectric element comprises silylation.

7. The method of claim 1 wherein said curing comprises a thermal cure, an electron beam cure, an ultra-violet (UV) cure, an ion beam cure, a plasma cure, a microwave cure or a combination thereof.

8. The method of claim 1 further comprising filling said at least one interconnect pattern within the cured permanent patterned dielectric material with an electrically conductive material and planarization.

9. The method of claim 1 further comprising forming a contact opening to said substrate, wherein said contacting opening is formed prior to or after said curing.

10. The method of claim 1 wherein said adding the at least one dielectric element comprises permeating a precursor including said at least one dielectric enabling element into said patterned dielectric photoresist.

11. The method of claim 10 wherein said precursor is a silica precursor selected from the group consisting of a silixone, halosilane, alkoxysilane, carbosilane and silsesquioxane.

12. The method of claim 1 wherein said adding further comprises using a catalyst.

13. The method of claim 1 wherein said adding further comprises using a reaction agent or reaction medium.

14. The method of claim 1 further comprising transferring said at least one interconnect pattern into at least a portion of said substrate after said adding the at least one dielectric enabling element into the patterned photoresist and prior to curing.

15. The method of claim 1 further comprising transferring said at least one interconnect pattern into at least a portion of said substrate after curing.

16. The method of claim 1 wherein said dielectric enabling element is Ti.

17. The method of claim 1 wherein said dielectric enabling element is Ge.

18. A method of forming a semiconductor structure comprising:
   forming a first photoresist on an upper surface of a substrate;
   forming at least one first interconnect pattern into the first photoresist providing a first patterned photoresist;
   forming a second photoresist within the at least one first interconnect pattern and atop the first patterned photoresist;
   forming at least one second interconnect pattern within the second photoresist providing a second patterned photoresist;
   adding at least one dielectric enabling element into the first and the second patterned photoresists to form first and second patterned photoresists including the at least one dielectric enabling element incorporated therein; and
   curing said first patterned photoresist and the second patterned photoresist containing the at least one dielectric enabling element into first and second cured permanent patterned dielectric materials, respectively.

19. The method of claim 18 further comprising forming a contact opening to said substrate, wherein said contacting opening is formed prior to or after said curing.

20. A method of forming a semiconductor structure comprising:
   forming a first photoresist on an upper surface of a substrate;
   forming at least one first interconnect pattern within the first photoresist providing a first patterned photoresist;
   adding at least one dielectric enabling element into the first patterned photoresist;
   curing the first patterned photoresist containing the at least one dielectric enabling element forming a first cured permanent patterned dielectric;
   forming a second photoresist atop the first cured permanent patterned dielectric;
   forming at least one second interconnect pattern within the second photoresist providing a second patterned photoresist;
   adding at least one other dielectric enabling element into the second patterned photoresist; and
   curing the second patterned photoresist containing the at least one other dielectric enabling element to form a second cured permanent patterned dielectric.

* * * * *